(12) United States Patent
Yamada

(10) Patent No.: US 7,667,267 B2
(45) Date of Patent: Feb. 23, 2010

(54) SEMICONDUCTOR DEVICE HAVING LDMOS TRANSISTOR AND METHOD FOR MANUFACTURING THE SAME

(75) Inventor: Akira Yamada, Nukata-gun (JP)

(73) Assignee: DENSO CORPORATION, Kariya (JP)

(*) Notice: Subject to any disclaimer, the term of this patent is extended or adjusted under 35 U.S.C. 154(b) by 561 days.

(21) Appl. No.: 11/526,652

(22) Filed: Sep. 26, 2006

(65) Prior Publication Data
US 2007/0069292 A1    Mar. 29, 2007

(30) Foreign Application Priority Data
Sep. 28, 2005 (JP) ............... 2005-282579
May 22, 2006 (JP) ............... 2006-142012

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ............... 257/335; 257/336; 257/E29.257

(58) Field of Classification Search ............... 257/334, 257/335, 336, 347, 348, 349, E29.256, E29.257
See application file for complete search history.

(56) References Cited

U.S. PATENT DOCUMENTS

| 5,485,030 | A | 1/1996 | Terashima |
| 5,561,077 | A | 10/1996 | Terashima |
| 5,736,774 | A | 4/1998 | Fujihira |
| 6,333,234 | B1 | 12/2001 | Liu |
| 7,315,062 | B2 * | 1/2008 | Ohtake ............... 257/335 |
| 2006/0087343 | A1 | 4/2006 | Himi et al. |

FOREIGN PATENT DOCUMENTS

WO    WO 03/036699    5/2003

OTHER PUBLICATIONS

Luo et al., *A Novel E-SIMOX SOI High Voltage Device Structure with Shielding Trench*, Proceedings of the International Conference on Communications, Circuits and Systems, 2005, vol. 2, May 27-30, 2005, pp. 1403-1406.

Office Action dated May 2, 2008 in corresponding German Patent Application No. 10 2006 045 214.3-33 (and English translation).

(Continued)

*Primary Examiner*—Hoai v Pham
(74) *Attorney, Agent, or Firm*—Posz Law Group, PLC

(57) ABSTRACT

A semiconductor device includes: a semiconductor substrate having a first semiconductor layer, an insulation layer and a second semiconductor layer, which are stacked in this order; a LDMOS transistor disposed on the first semiconductor layer; and a region having a dielectric constant, which is lower than that of the first or second semiconductor layer. The region contacts the insulation layer, and the region is disposed between a source and a drain of the LDMOS transistor. The device has high withstand voltage in a direction perpendicular to the substrate.

15 Claims, 7 Drawing Sheets

OTHER PUBLICATIONS

*Progress in Power ICs and MEMs, "Analog" Technologies to Interface the Real World*, 2004, C. Contiero, B. Murari and B. Vigna (discussed on p. 1 in the specification).

*A High Breakdown Voltage IC with Lateral Power Device based on SODI Structure*, Proceedings of 2004 International Symposium on Power Semiconductor Devices & ICs, Kitakyushu, pp. 375-378.

*New 1200V MOSFET Structure on SOI with SIP Proceeding Layer*, proceedings of 1998 International Symposium on Power Semi Devices & ICs, Kyoto, pp. 25-28; H. Funaki, Y. Yamaguchi, K. Hirayama.

*Realization of High Breakdown Voltage (>700 V) in Thin SOI Devices*, 1991 IEEE, pp. 31-35; S. Merchant, E. Arnold, H. Baumgart, S. Mukherjee, H. Pein, and R. Pinker.

\* cited by examiner

SEMICONDUCTOR DEVICE HAVING LDMOS TRANSISTOR AND METHOD FOR MANUFACTURING THE SAME

CROSS REFERENCE TO RELATED APPLICATIONS

This application is based on Japanese Patent Applications No. 2005-282579 filed on Sep. 28, 2005, and No. 2006-142012 filed on May 22, 2006, the disclosures of which are incorporated herein by reference.

FIELD OF THE INVENTION

The present invention relates to a semiconductor device having a LDMOS transistor and a method for manufacturing the same.

BACKGROUND OF THE INVENTION

For example, a high voltage IC for inverter driving, etc. is disclosed in U.S. Pat. No. 5,736,774 and Proceeding of ISPSD 2004, page 385.

FIG. 7 shows a typical sectional view of a high voltage IC 9 of the background art using a SOI substrate and trench separation.

In the high voltage IC 9 shown in FIG. 7, a low electric potential (GND) reference circuit, a high electric potential (floating) reference circuit and a level shift circuit are respectively arranged in a SOI layer 1a of the SOI substrate 1 having a burying oxide film 3. In the low electric potential (GND) reference circuit, a GND electric potential is set to a reference electric potential, and this low electric potential reference circuit is operated at ±15V. For example, the high electric potential (floating) reference circuit is operated with a high electric potential of 600V or more as a reference electric potential in a high voltage IC used in inverter driving for vehicle mounting. The level shift circuit transmits signals between the low electric potential reference circuit and the high electric potential reference circuit.

As shown in FIG. 7, each of forming areas of the GND reference circuit, the floating reference circuit and the level shift circuit is insulated (dielectric) and separated by the burying oxide film 3 of the SOI substrate 1 and a side wall oxide film 4s of a trench 4. In the high voltage IC 9, the rear face of a support substrate 2 is connected to GND to stabilize the electric potential.

In the level shift circuit of the high voltage IC 9, a circuit element of a high withstand voltage is required to connect the low electric potential reference circuit and the high electric potential reference circuit. For example, in the high voltage IC 9 of 600V or more, a circuit element having a withstand voltage of 600V or more is required. A lateral double-diffused MOS transistor (LDMOS) 9a of the forming area of the level shift circuit shown in FIG. 7 takes a so-called SOI-RESURF structure (double RESURF structure) in which a depletion layer is spread from both a PN junction face located in the surface layer portion of the SOI layer 1a and the burying oxide film 3 to secure the withstand voltage.

As shown in FIG. 7, the high voltage in the level shift circuit is applied to a drain D of LDMOS 9a. In LDMOS 9a of FIG. 7, the withstand voltage of the lateral direction of a section is secured by the SOI-RESURF structure formed by a surface p-type impurity layer and the burying oxide film 3. Further, with respect to the withstand voltage of the longitudinal direction of the section, the high voltage applied between the drain D and the ground (GND) is partially divided by the SOI layer 1a of low concentration and the burying oxide film 3, and an electric field in the SOI layer 1a is relaxed.

FIGS. 8A and 8B show simulation results of an electric potential distribution at a high voltage applying time with respect to a semiconductor device 9b in which LDMOS similar to the above LDMOS 9a is formed. FIG. 8A is a typical sectional view of the semiconductor device 9b. FIG. 8B is a view showing the electric potential distribution at a breakdown time. In the semiconductor device 9b of FIGS. 8A and 8B, portions similar to those of LDMOS 9a of FIG. 7 are designated by the same reference numerals.

As shown in FIG. 8B, the withstand voltage of the semiconductor device 9b shown in FIG. 8A is 640V. In FIG. 8B, an equipotential line is close in the longitudinal direction on the drain D side of LDMOS formed in the SOI layer 1a. In other words, in the semiconductor device 9b of FIG. 8A, an electric force line is concentrated on the drain D side of LDMOS at the high voltage applying time. Therefore, the withstand voltage 640V of the semiconductor device 9b is applied in the longitudinal direction of the section of the SOI layer 1a on the drain D side of LDMOS.

The withstand voltage V of the longitudinal direction of LDMOS formed in the SOI layer 1a is generally generated by connecting the rear face of the support substrate 2 to GND, and is represented by the following formula No. 1.

$$V \propto (t_s/2 + 3t_{ox}) \times t_s / \epsilon_0 \tag{F1}$$

In the formula No. 1, $t_s$ is the thickness of the SOI layer 1a, and $t_{ox}$ is the thickness of the burying oxide film 3, and $\epsilon_0$ is the dielectric constant of the burying oxide film 3. Accordingly, as can be seen from the formula No. 1, the withstand voltage of the longitudinal direction is determined by the thickness $t_s$ of the SOI layer 1a, the thickness $t_{ox}$ of the burying oxide film 3 and the dielectric constant $\epsilon_0$ of the burying oxide film 3. Accordingly, it is necessary to thicken the thickness $t_s$ of the SOI layer 1a, or thicken the thickness $t_{ox}$ of the burying oxide film 3 so as to improve the withstand voltage of the semiconductor device 9b by a size design. For example, when a high withstand voltage of 1000V or more is intended to be obtained, the burying oxide film thicker than 5 μm and the SOI layer thicker than 50 μm are required. However, the thickness $t_s$ of the SOI layer 1a has a limit thickness of 20 μm shown in FIG. 8A from a limit of a processing technique of the trench 4 formed in a subsequent process. Further, the thickness $t_{ox}$ of the burying oxide film 3 has a limit film thickness of 4 μm from the limits of a warp amount of a wafer of the SOI substrate 1 formed by sticking and cost of a raw ore. Therefore, in the semiconductor device 9b shown in FIGS. 8A and 8B, it is difficult to secure a withstand voltage greater than 640V. Accordingly, in LDMOS 9a having a structure similar to that of the semiconductor device 9b of FIGS. 8A and 8B and applied to the level shift circuit of the high voltage IC 9 of FIG. 7, it is impossible to secure a withstand voltage of 1200V required in an EV vehicle, etc.

SUMMARY OF THE INVENTION

In view of the above-described problem, it is an object of the present disclosure to provide a semiconductor device having a LDMOS transistor. It is another object of the present disclosure to provide a method for manufacturing a semiconductor device having a LDMOS transistor.

According to a first aspect of the present disclosure, a semiconductor device includes: a semiconductor substrate having a first semiconductor layer, an insulation layer and a second semiconductor layer, which are stacked in this order;

a LDMOS transistor disposed on the first semiconductor layer; and a region having a dielectric constant, which is lower than that of the first or second semiconductor layer. The region contacts the insulation layer, and the region is disposed between a source and a drain of the LDMOS transistor.

Since the above device includes the region contacting the insulation layer, the device has the same effect as a case where the thickness of the insulation layer is large. Further, since the region is disposed between the source and the drain in the LDMOS transistor, the electric potential to be applied to the semiconductor layer is reduced when a high voltage is applied to the drain or the source. Thus, the withstand voltage of the device in the vertical direction of the substrate is improved, so that the device has high withstand voltage.

According to a second aspect of the present disclosure, a method for manufacturing a semiconductor device includes: forming a region on a surface of a first semiconductor substrate, wherein the region has a dielectric constant, which is lower than that of the first semiconductor substrate; forming an insulation layer on a surface of a second semiconductor substrate; bonding the first and second semiconductor substrates in such a manner that the region on the first semiconductor substrate contacts the insulation layer on the second semiconductor substrate; and forming a LDMOS transistor in the first semiconductor layer. The region is disposed between a source and a drain of the LDMOS transistor. The above method provides the device having a high withstand voltage of the device in the vertical direction of the substrate.

According to a third aspect of the present disclosure, a method for manufacturing a semiconductor device includes: preparing a semiconductor substrate having a first semiconductor layer, an insulation layer and a second semiconductor layer, which are stacked in this order; forming a LDMOS transistor in the first semiconductor layer; forming a trench on a surface of the first semiconductor layer, wherein the trench reaches the insulation layer; and forming a region disposed between the first semiconductor layer and the insulation layer by etching a sidewall of the trench. The region has a dielectric constant, which is lower than that of the first semiconductor layer, and the region is disposed between a source and a drain of the LDMOS transistor. The above method provides the device having a high withstand voltage of the device in the vertical direction of the substrate.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1A:
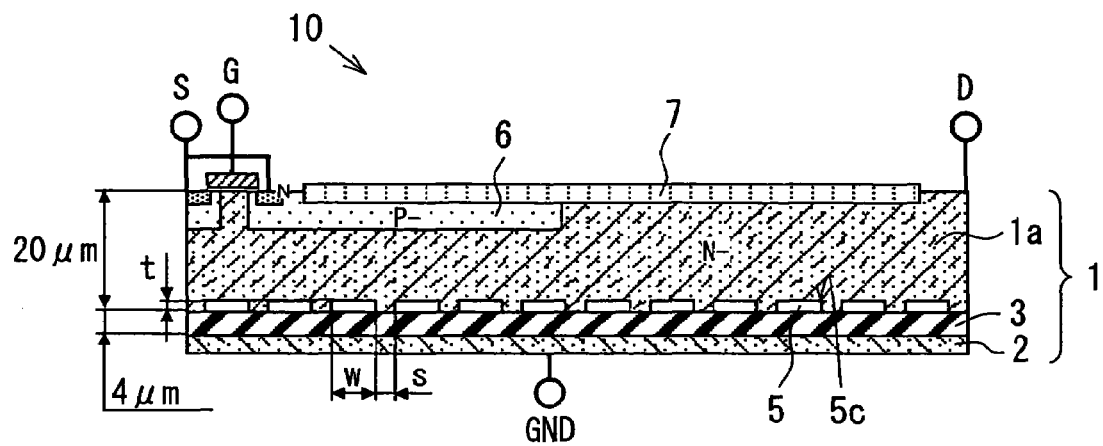
FIG. 1A is a cross sectional view showing a semiconductor device according to an example embodiment.
Figure 1B:
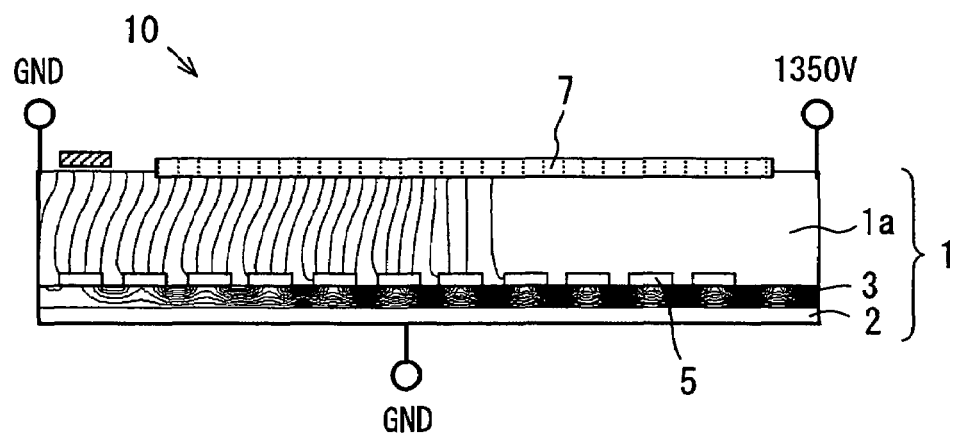
FIG. 1B is a cross sectional view showing electric potential distribution of the device when the device is broken down.
Figure 8A:
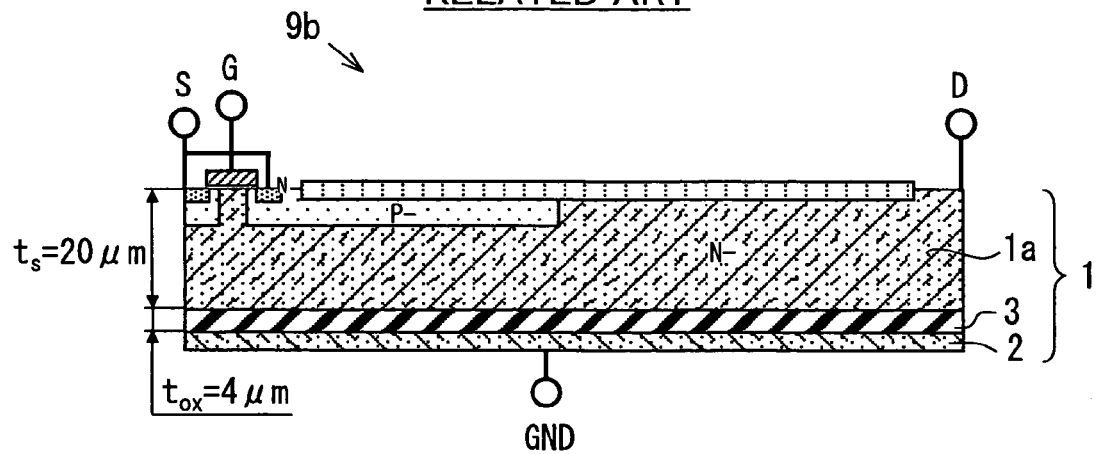
FIG. 8A is a cross sectional view showing a semiconductor device as a comparison.
Figure 8B:
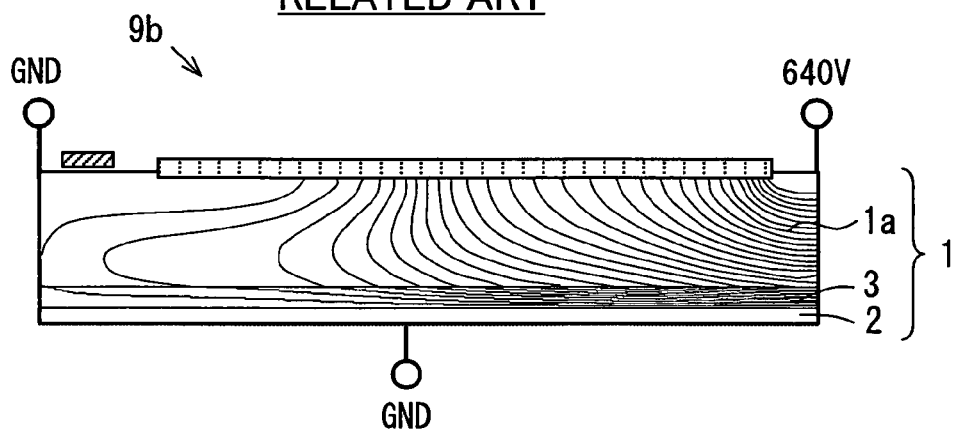
FIG. 8B is a cross sectional view showing electric potential distribution of the device when the device is broken down.

FIGS. 1A and 1B are views showing a semiconductor device 10 as one example embodiment. FIG. 1A is a typical sectional view of the semiconductor device 10. FIG. 1B is a view showing an electric potential distribution at a breakdown time. In the semiconductor device 10 shown in FIGS. 1A and 1B, portions similar to those of the semiconductor device 9b shown in FIGS. 8A and 8B are designated by the same reference numerals. Further, in FIGS. 1 and 8, the thickness direction of a support substrate 2 is shortened and described to simplify these figures.

In the semiconductor device 10 shown in FIG. 1A, similar to the semiconductor device 9b shown in FIG. 8A, a transversal type MOS transistor (LDMOS) is formed in a surface layer portion of a SOI layer 1a located on a burying oxide film 3. The SOI layer 1a of the semiconductor device 10 is an N electric conductivity type (N−) and has a substrate structure suitable for utilization with respect to a circuit using a positive high voltage electric power source. Further, the semiconductor device 10 has a so-called SOI-RESURF structure (double RESURF structure) in which a P electric conductivity type (P−) area 6 is formed from a source (electrode) S of LDMOS to a drain (electrode) D in the surface layer portion of the SOI layer 1a. Reference numeral 7 located on the SOI layer 1a shows LOCOS (Local Oxidation of Silicon).

On the other hand, the semiconductor device 10 shown in FIG. 1A has a structure in which a hollow groove 5 divided into plural portions is additionally formed with respect to the structure of the semiconductor device 9b shown in FIG. 8A. The hollow groove 5 of the semiconductor device 10 abuts on the burying oxide film 3 and is divided into plural portions and is formed between the source (electrode) S and the drain (electrode) D of LDMOS in a lower layer portion of the SOI layer 1a. The plural hollow grooves 5 are formed at an equal thickness t in the thickness direction of the SOI layer 1a. Further, the plural hollow grooves 5 are formed at an equal width w in the width direction of the source S and the drain D of LDMOS, and are arranged in parallel at an equal interval s. The interior of the hollow groove 5 is a vacuum or the atmospheric air, and the hollow groove 5 becomes a low dielectric constant area lower in dielectric constant than silicon (Si). Therefore, in the semiconductor device 10, the thickness of the SOI layer 1a constructed by silicon (Si) of a high relative dielectric constant (=11.9) is substantially reduced.

As shown in FIG. 1B, the withstand voltage of the semiconductor device 10 is 1350V. In the semiconductor device 10, the plural hollow grooves 5 abut on the burying oxide film 3 and are suitably arranged between the source S and the drain D of LDMOS in the lower layer portion of the SOI layer 1a. Thus, as shown in FIG. 1B, at a high voltage applying time to the drain D, an electric potential distribution in the longitudinal direction of a section of the SOI layer 1a is vanished and only an electric potential distribution of the transversal direction is formed on the drain D side. In other words, a distribution state of an equipotential line shown in FIG. 1B is a state in which an area for perfectly depleting the SOI layer 1a is formed. Thus, in the semiconductor device 10, the withstand voltage in the longitudinal direction of the section of the substrate 1 is improved, and a high withstand voltage of 1350V is provided in comparison with a withstand voltage 640V of the semiconductor device 9a shown in FIGS. 8A and 8B.

As mentioned above, in the semiconductor device 10, the plural hollow grooves 5 are formed at the equal thickness t in the thickness direction of the SOI layer 1a. Thus, the thickness of the SOI layer 1a is substantially averagely reduced, and a stable withstand voltage improving effect in the longitudinal direction of the section of the substrate 1 can be obtained. However, the invention is not limited to this effect, but the thicknesses t of the plural hollow grooves 5 may be also individually different, and can be optimized in accordance with a generating situation of the equipotential line using a simulation.

Similarly, in the semiconductor device 10, the plural hollow grooves 5 are formed at the equal width w in the width direction of the source S and the drain D of LDMOS, and are arranged in parallel at the equal interval s. Thus, the hollow grooves 5 arranged between the source S and the drain D of LDMOS are uniformed. Therefore, a perfect depletion forming area of the SOI layer 1a formed at a high voltage applying time is stabilized, and the above stable withstand voltage improving effect can be obtained. However, the invention is not limited to this effect, but the widths w and the intervals s of the plural hollow grooves 5 may be also individually different, and can be optimized in accordance with a generating situation of the equipotential line using a simulation.

As mentioned above, the withstand voltage improving effect using the formation of the above hollow groove 5 is generated since the hollow groove 5 functions as a low dielectric constant area lower in dielectric constant than silicon (Si) constituting the SOI layer 1a. The hollow groove 5 in the semiconductor device 10 has a relative dielectric constant of 1 as a lowest value. Therefore, a maximum withstand voltage improving effect can be realized by the small hollow groove 5.

However, the invention is not limited to this effect, but a burying groove of one of silicon oxide, silicon oxide containing carbon (SiOC), FSG (SiOF), fluorinated polyimide and CPFP may be also adopted as the low dielectric constant area instead of the hollow groove 5. The burying groove of silicon oxide has a relative dielectric constant of about 4. SiOC has a relative dielectric constant of about 2.7. SiOF has a relative dielectric constant of about 3.0. Fluorinated polyimide has a relative dielectric constant of about 2.5. CPFP (Cyclized Perfluoropolymer) has a relative dielectric constant of about 2.1. Therefore, the same effects as a reduction of the thickness of the SOI layer 1a and substantial thickening of the burying oxide film 3 can be obtained by setting the low dielectric constant area to the burying groove of one of these materials. Accordingly, similar to the above description, it is possible to set a semiconductor device for improving the withstand voltage in the longitudinal direction of the section of the substrate 1, and having a high withstand voltage. In this case, structural strength deterioration can be restrained in comparison with a case in which the low dielectric constant area is set to the hollow groove.

In the semiconductor device 10 shown in FIG. 1A, as mentioned above, the so-called SOI-RESURF structure (double RESURF structure) for forming the P electric conductivity type (P−) area 6 in the surface layer portion of the SOI layer 1a is adopted. A state for perfectly depleting the SOI layer 1a shown in FIG. 1B does not depend on the existence of the P electric conductivity type area 6, and the P electric conductivity type area 6 can be also omitted. However, the depletion layer is easily spread at the high voltage applying time by forming the P electric conductivity type area 6. Therefore, it is possible to set a semiconductor device for stabilizing the perfect depletion forming area of the SOI layer 1a and having a high withstand voltage.

As mentioned above, the semiconductor device 10 shown in FIGS. 1A and 1B can be set to have a withstand voltage of 700V or more which is difficult to be secured in the semiconductor device 9b of the background art shown in FIGS. 8A and 8B. Accordingly, the above semiconductor device 10 is suitable in a case used in a level shift circuit in a high voltage IC for inverter driving as a semiconductor device for vehicle mounting. The above semiconductor device 10 can secure a withstand voltage of 1200V required in a 400V electric power system, an EV vehicle, etc.

Next, a manufacturing method of the semiconductor device 10 of FIG. 1A will be explained.

Figure 2A:
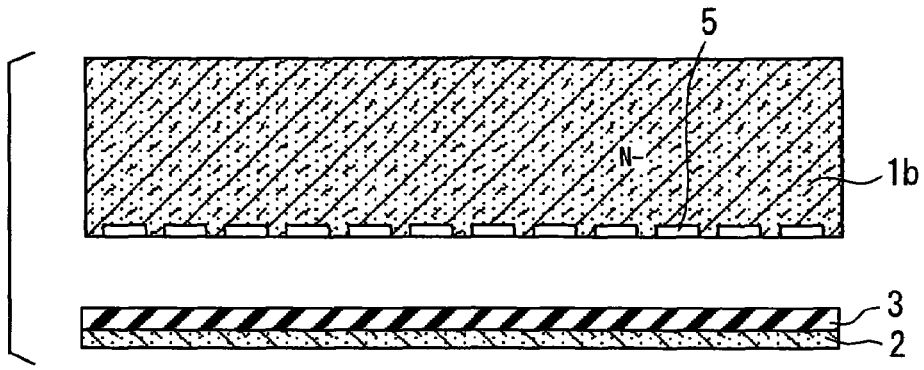
FIGS. 2A and 2B are cross sectional views explaining a method for manufacturing the device having a groove.
Figure 2B:
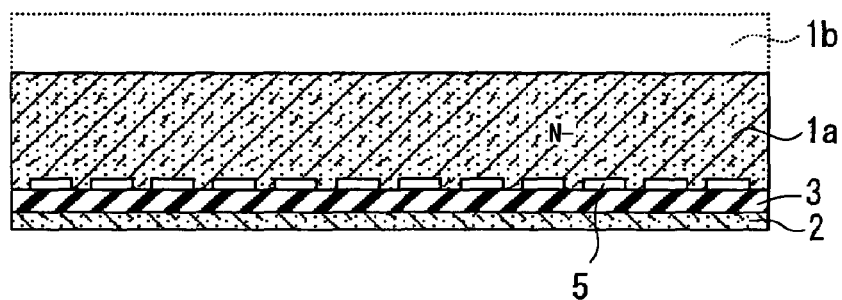

FIGS. 2A and 2B are cross-sectional views every process for explaining a forming process of the hollow groove 5 as a main portion of the semiconductor device 10. In FIGS. 2A and 2B, the thickness direction of the support substrate 2 is also shortened and described to simplify these figures.

First, as shown in FIG. 2A, two silicon substrates are prepared, and a groove 5 as the hollow groove 5 of FIG. 1A is formed on the surface of one silicon substrate 1b. The groove 5 is formed by photolithography and dry etching. When the burying groove of silicon oxide is adopted instead of the hollow groove 5 of FIG. 1A, one of silicon oxide, silicon oxide containing carbon (SiOC), FSG (SiOF), fluorinated polyimide and CPFP is buried into the groove 5, and the surface is then polished to be flattened.

Further, an oxide film 3 as the burying oxide film 3 of FIG. 1A is formed on the surface of the other silicon substrate 2 by thermal oxidation.

Next, as shown in FIG. 2B, the two silicon substrates 1b, 2 are stuck within a vacuum so as to abut the groove 5 and the oxide film 3 by using a general substrate sticking technique in manufacture of the semiconductor device. Next, the stuck silicon substrate 1b is ground and polished from the surface side, and is set to a SOI layer 1a.

Thus, a basic structural portion of the semiconductor device 10 for abutting the hollow groove 5 on the burying oxide film 3 and forming the hollow groove 5 in a lower layer portion of the SOI layer 1a is completed. Thereafter, the semiconductor device 10 of FIG. 1A is manufactured by making LDMOS in the SOI layer 1a by a normal manufacturing technique of the semiconductor device.

In accordance with the above manufacturing method, the groove 5 shown in FIGS. 2A and 2B can be precisely formed. Accordingly, it is possible to manufacture the semiconductor device 10 having the hollow groove 5 (or the burying groove of silicon oxide) good in size accuracy.

Figure 3:
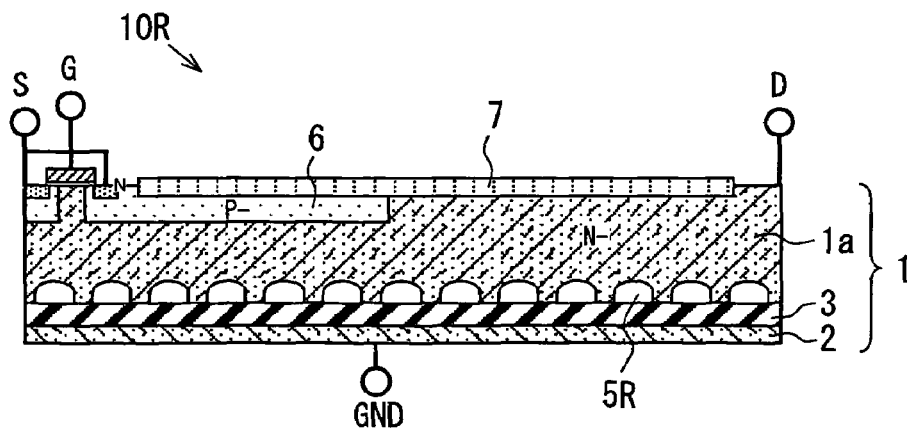
FIG. 3 is a cross sectional view showing another semiconductor device.

FIG. 3 is a typical sectional view of a semiconductor device 10R as another example of the semiconductor device. In the semiconductor device 10R of FIG. 3, portions similar to those of the semiconductor device 10 shown in FIG. 1A are designated by the same reference numerals.

In the semiconductor device 10 of FIG. 1A, the sectional shape of the hollow groove 5 is a rectangular shape, and has a sharpened corner portion 5c. In contrast to this, in the semiconductor device 10R of FIG. 3, a hollow groove 5R having a rounded corner portion is arranged on the burying oxide film 3.

It is preferable to set the corner portion 5c of the hollow groove 5 in the semiconductor device 10 of FIG. 1A to be rounded as in the semiconductor device 10R of FIG. 3. Thus, electric field concentration in the corner portion 5c of the hollow groove 5 at a high voltage applying time can be relaxed, and the above withstand voltage improving effect can be stably obtained. Further, it is difficult to structurally concentrate stress in comparison with a case in which the corner portion of a low dielectric constant area is sharpened. Therefore, a yield reduction due to a crystal defect of Si, etc. can be restrained.

Figure 4A:
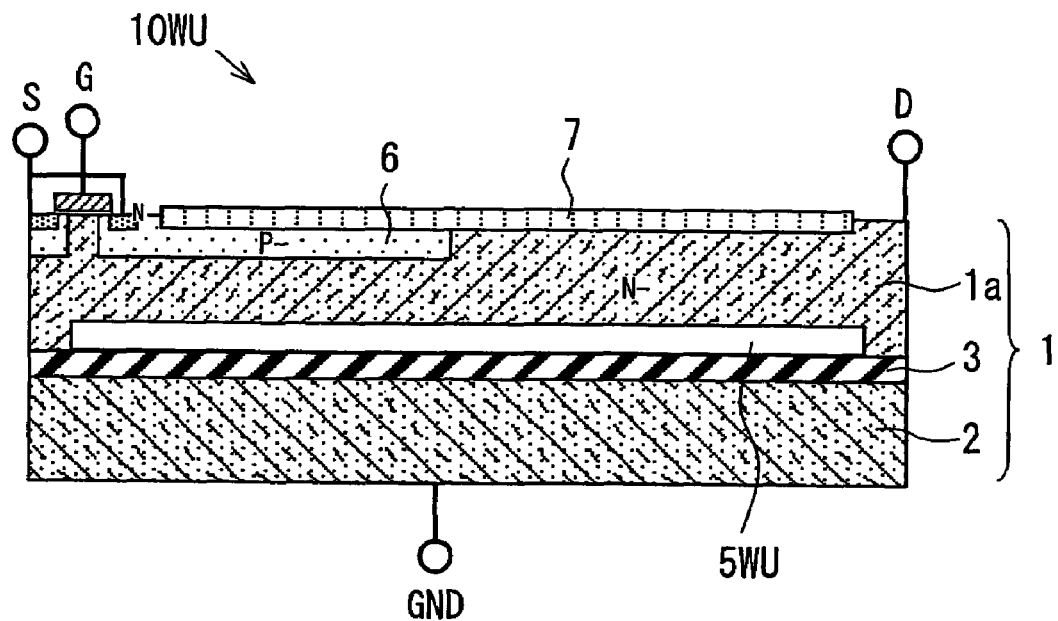
FIGS. 4A and 4B are cross sectional views showing further other semiconductor devices.
Figure 4B:
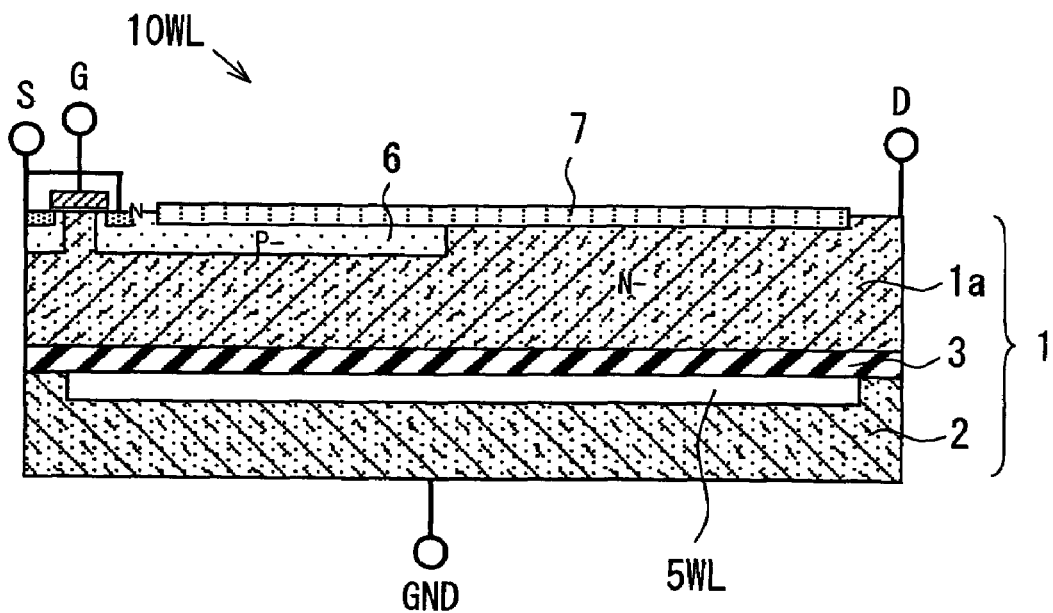

FIGS. 4A and 4B show other examples of the semiconductor device, and are respectively typical sectional views of semiconductor devices 10WU, 10WL. In the semiconductor devices 10WU, 10WL of FIGS. 4A and 4B, portions similar to those of the semiconductor device 10 of FIG. 1A are designated by the same reference numerals.

In the semiconductor device 10 of FIG. 1A, the hollow groove 5 abuts on the burying oxide film 3, and is divided into plural portions between the source S and the drain D of LDMOS and is formed in the lower layer portion of the SOI layer 1a. In contrast to this, in the semiconductor device 10WU of FIG. 4A, a hollow groove 5WU of an integral structure abuts on the burying oxide film 3, and is formed between the source S and the drain D of LDMOS in the lower layer portion of the SOI layer 1a. Further, in the semiconductor device 10WL of FIG. 4B, a hollow groove 5WL of an integral structure abuts on the burying oxide film 3, and is formed between the source S and the drain D of LDMOS in an upper layer portion of the support substrate 2.

In the semiconductor devices 10WU, 10WL of FIGS. 4A and 4B, effects similar to those of thickening of the burying oxide film 3 are also obtained by forming the hollow grooves 5WU, 5WL of an integral structure so as to abut on the burying oxide film 3. Further, an electric potential born by the SOI layer 1a can be reduced at a high voltage applying time to the drain or the source by arranging the hollow grooves 5WU, 5WL between the source and the drain of LDMOS. Thus, it is possible to set a semiconductor device for improving the withstand voltage in the longitudinal direction of the section of the substrate 1, and having a high withstand voltage.

Figure 5A:
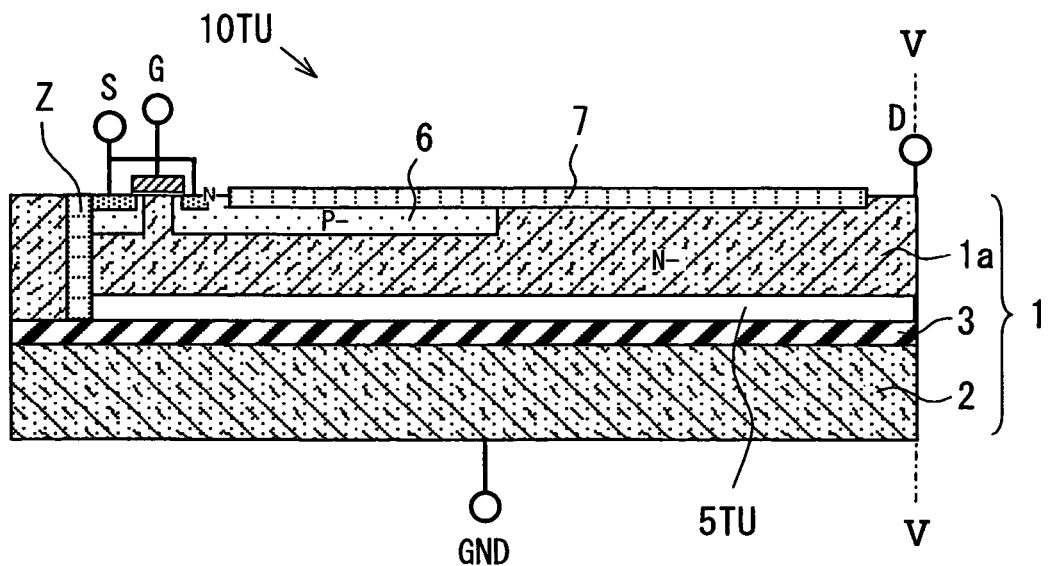
FIGS. 5A and 5B are cross sectional views showing furthermore other semiconductor devices.
Figure 5B:
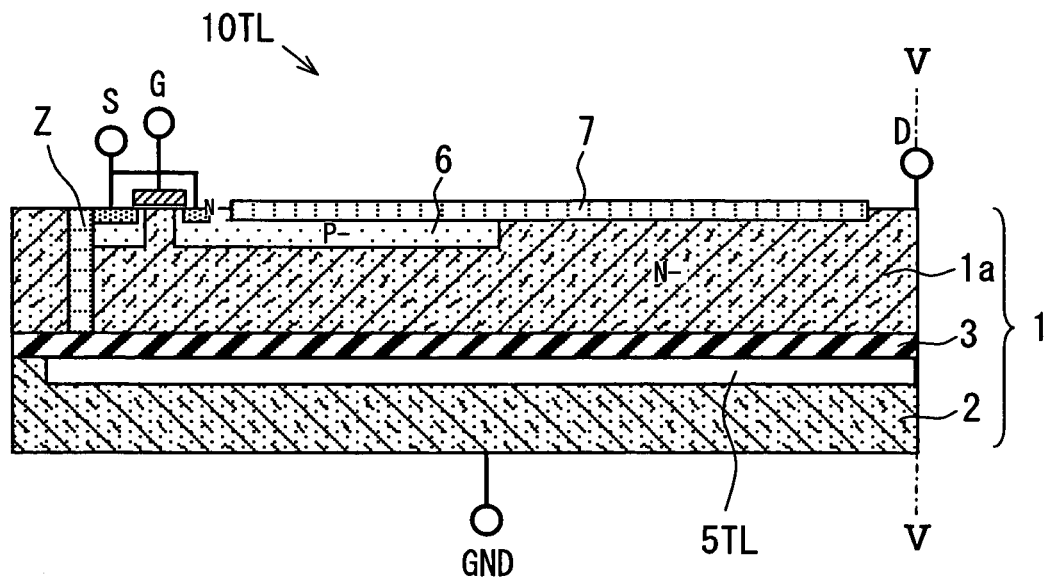

FIGS. 5A and 5B show further other examples of the semiconductor devices 10WU, 10WL, compared with the devices shown in FIGS. 4A and 4B, and are respectively typical sectional views of semiconductor devices 10TU, 10TL. In the semiconductor devices 10TU, 10TL of FIGS. 5A and 5B, portions similar to those of the semiconductor devices 10WU, 10WL of FIGS. 4A and 4B are designated by the same reference numerals.

In the semiconductor devices 10TU, 10TL shown in FIGS. 5A and 5B, a one-dotted chain line V-V of a right-hand end becomes a rotation symmetrical axis, and LDMOS of each of the semiconductor devices 10TU, 10TL is insulated and separated by an insulating-separating trench Z reaching the burying oxide film 3. As shown in FIGS. 5A and 5B, hollow grooves 5TU, 5TL in the respective semiconductor devices 10TU, 10TL are formed so as to occupy the entire area of a region surrounded by the insulating-separating trench Z on a substrate face.

In the semiconductor devices 10TU, 10TL of FIGS. 5A and 5B, the hollow grooves 5TU, 5TL abutting on the burying oxide film 3 are formed in the entire area of the SOI layer 1a surrounded by the insulating-separating trench Z forming LDMOS therein. Therefore, effects similar to those of thickening of the burying oxide film 3 are obtained in the entire area of the SOI layer 1a surrounded by the insulating-separating trench Z. Therefore, it is possible to set a semiconductor device for easily making a withstand voltage design and having a high withstand voltage in the longitudinal direction.

In the semiconductor devices 10WU, 10WL of FIGS. 4A and 4B and the semiconductor devices 10TU, 10TL of FIGS. 5A and 5B, a burying groove of one of silicon oxide, silicon oxide containing carbon (SiOC), FSG (SiOF), fluorinated polyimide and CPFP may be also formed instead of the hollow grooves 5WU, 5WL, 5TU, 5TL.

Figure 6A:
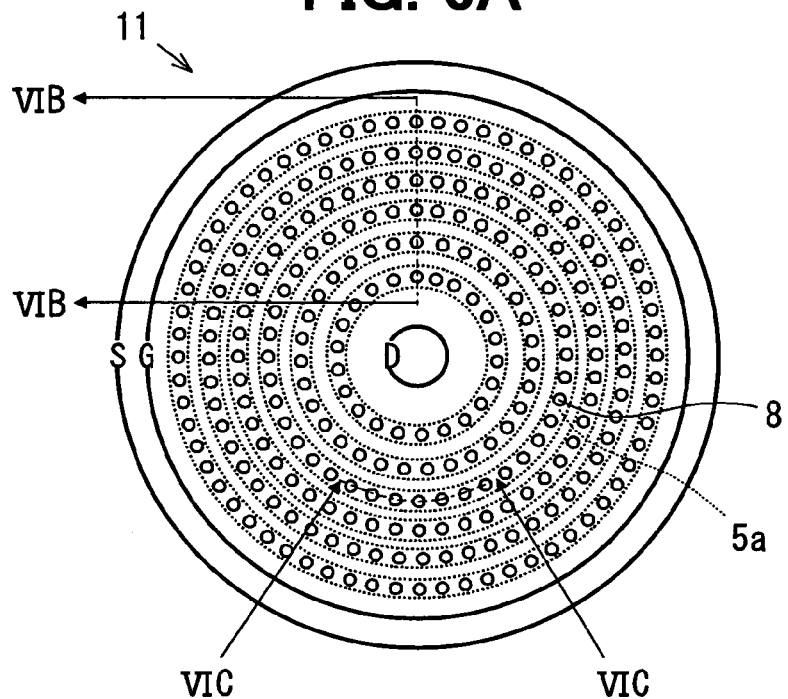
FIG. 6A is a plan view showing another semiconductor device.
Figure 6B:
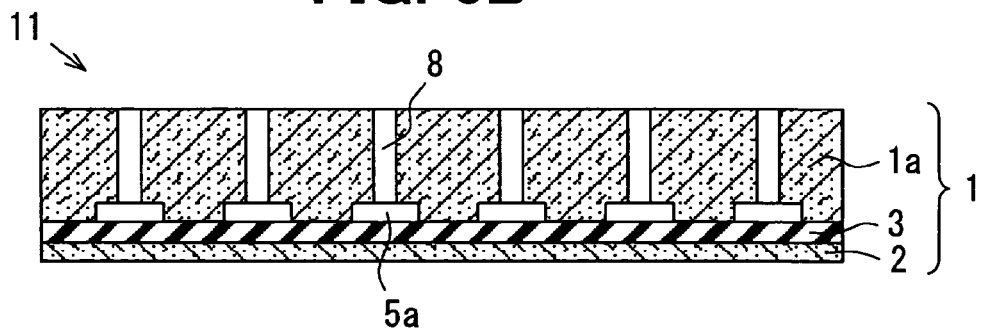
FIG. 6B is a cross sectional view showing the device taken along line VIB-VIB in FIG. 6A.
Figure 6C:
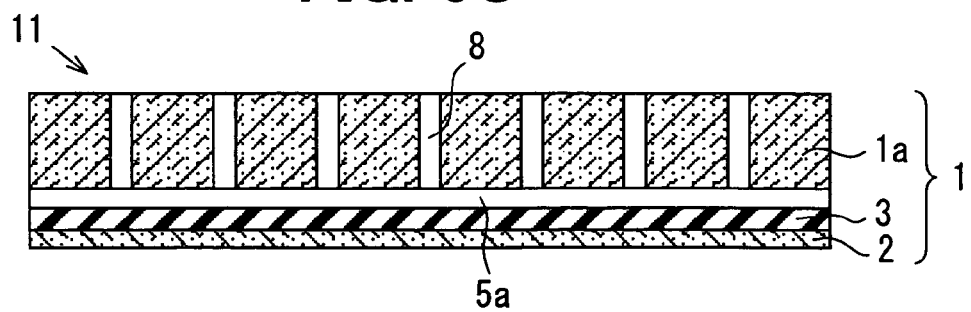
FIG. 6C is a cross sectional view showing the device taken along line VIC-VIC in FIG. 6A.
Figure 7:
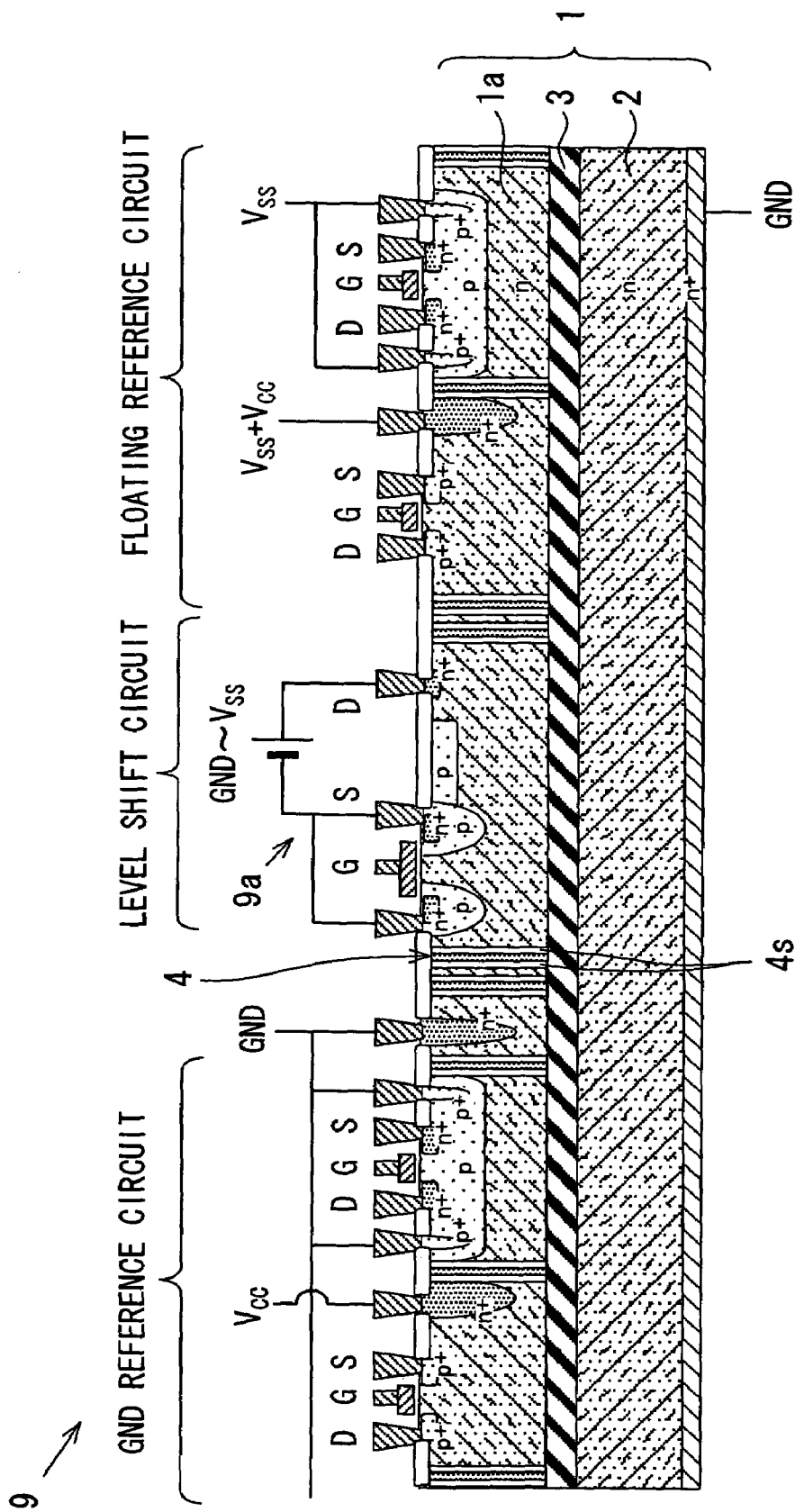
FIG. 7 is a semiconductor device according to a prior art.

FIGS. 6A to 6C are views showing another semiconductor device 11 and its manufacturing method. FIG. 6A is a typical top view of the semiconductor device 11. FIG. 6B is a typical sectional view on a one-dotted chain line VIIB-VIIB shown in FIG. 6A. FIG. 6C is a typical sectional view on a one-dotted chain line VIIC-VIIC shown in FIG. 6A. In the semiconductor device 11 shown in FIGS. 6A to 6C, portions similar to those of the semiconductor devices 10, 9b shown in FIGS. 1A and 8A are also designated by the same reference numerals. Further, the thickness direction of a support substrate 2 is shortened and described to simplify these figures and the description of a sectional structure of LDMOS is omitted.

In the semiconductor device 11 shown in FIGS. 6A to 6C, similar to the semiconductor device 10 shown in FIG. 1A, a transversal type MOS transistor (LDMOS) is formed in a surface layer portion of the SOI layer 1a located on the burying oxide film 3. Further, in the semiconductor device 11, as shown in FIG. 6B, plural hollow grooves 5a abut on the burying oxide film 3 and are formed in a lower layer portion of the SOI layer 1a between the source S and the drain D of LDMOS. Accordingly, similar to the semiconductor device 10 shown in FIG. 1A, it is also possible to set a semiconductor device for forming an area for perfectly depleting the SOI layer 1a at the high voltage applying time to the drain D and having a high withstand voltage with respect to the semiconductor device 11.

On the other hand, the semiconductor device 11 shown in FIGS. 6A to 6C has a structure for adding a trench 8 to the structure of the semiconductor device 10 shown in FIG. 1A. This trench 8 is arranged to form the hollow groove 5a. The hollow groove 5 in the semiconductor device 10 of FIG. 1A is formed before sticking of the substrate shown in FIG. 2A. In contrast to this, the hollow groove 5a of the semiconductor device 11 is formed after the sticking of the substrate. Namely, the hollow groove 5a of the semiconductor device 11 shown in FIGS. 6A to 6C is formed as follows.

First, a SOI structure having the burying oxide film 3 by sticking two silicon substrates is set. Thereafter, one silicon substrate is ground and polished, and a SOI layer 1a is formed. Next, the trench 8 is perpendicularly formed from the surface of the SOI layer 1a located on the burying oxide film 3 by anisotropic etching. Next, the hollow groove 5a is formed by side-etching a tip portion of the trench 8. Thus, a basic structural portion of the semiconductor device 11 for abutting the hollow groove 5a on the burying oxide film 3 and forming the hollow groove 5a in a lower layer portion of the SOI layer 1a is completed.

Thereafter, the semiconductor device 11 shown in FIGS. 6A to 6C is manufactured by making LDMOS in the SOI layer 1a by a normal manufacturing technique of the semiconductor device. In accordance with the above manufacturing method, there is a merit enabling the formation of the hollow groove 5a after the sticking of the silicon substrate in comparison with the manufacturing method shown in FIGS. 2A and 2B.

As mentioned above, in the semiconductor device and its manufacturing method of the invention mentioned above, the transversal type MOS transistor (LDMOS) is formed in the surface layer portion of the SOI layer located on the burying oxide film, and the withstand voltage in the longitudinal direction of a substrate section is improved, and a high withstand voltage of 700V or more is provided.

The above disclosure has the following aspects.

According to a first aspect of the present disclosure, a semiconductor device includes: a semiconductor substrate having a first semiconductor layer, an insulation layer and a second semiconductor layer, which are stacked in this order; a LDMOS transistor disposed on the first semiconductor layer; and a region having a dielectric constant, which is lower than that of the first or second semiconductor layer. The region contacts the insulation layer, and the region is disposed between a source and a drain of the LDMOS transistor.

Since the above device includes the region contacting the insulation layer, the device has the same effect as a case where the thickness of the insulation layer is large. Further, since the region is disposed between the source and the drain in the LDMOS transistor, the electric potential to be applied to the semiconductor layer is reduced when a high voltage is applied to the drain or the source. Thus, the withstand voltage of the device in the vertical direction of the substrate is improved, so that the device has high withstand voltage.

Alternatively, the region may be disposed between the first semiconductor layer and the insulation layer. Further, the region may include a plurality of parts. In this case, when the high voltage is applied to the drain or the source, the electric distribution in the vertical direction is homogenized, so that a complete depletion region is provided in the semiconductor layer. Thus, the withstand voltage of the device is much improved.

Alternatively, each part of the region may have a same thickness in a direction perpendicular to the semiconductor substrate. In this case, the thickness of the semiconductor layer is essentially reduced so that the withstand voltage of the device in the vertical direction is improved. Alternatively, each part of the region may have a same width in a direction parallel to a direction between the source and the drain of the LDMOS transistor. In this case, the region between the drain and the source is formed uniformly; and therefore, the complete depletion region is stabilized. Alternatively, the parts of the region may be arranged equally spaced in a direction parallel to a direction between the source and the drain of the LDMOS transistor.

Alternatively, the device may further include a trench for electrically isolating the LDMOS transistor. The trench reaches the insulation layer. The trench surrounds a portion of the first semiconductor layer, and the region corresponds to whole area of the portion of the first semiconductor layer.

Alternatively, the device may have a withstand voltage, which is equal to or larger than 700 volts. Further, the device may be an in-vehicle semiconductor device for an automotive vehicle, and the device provides a level shift circuit in a high voltage IC for driving an inverter.

According to a second aspect of the present disclosure, a method for manufacturing a semiconductor device includes: forming a region on a surface of a first semiconductor substrate, wherein the region has a dielectric constant, which is lower than that of the first semiconductor substrate; forming an insulation layer on a surface of a second semiconductor substrate; bonding the first and second semiconductor substrates in such a manner that the region on the first semiconductor substrate contacts the insulation layer on the second semiconductor substrate; and forming a LDMOS transistor in the first semiconductor layer. The region is disposed between a source and a drain of the LDMOS transistor. The above method provides the device having a high withstand voltage of the device in the vertical direction of the substrate.

According to a third aspect of the present disclosure, a method for manufacturing a semiconductor device includes: preparing a semiconductor substrate having a first semiconductor layer, an insulation layer and a second semiconductor layer, which are stacked in this order; forming a LDMOS transistor in the first semiconductor layer; forming a trench on a surface of the first semiconductor layer, wherein the trench reaches the insulation layer; and forming a region disposed between the first semiconductor layer and the insulation layer by etching a sidewall of the trench. The region has a dielectric constant, which is lower than that of the first semiconductor layer, and the region is disposed between a source and a drain of the LDMOS transistor. The above method provides the device having a high withstand voltage of the device in the vertical direction of the substrate.

Alternatively, the semiconductor substrate may be a SOI substrate. The insulation layer is a silicon oxide layer. The first and second semiconductor layers are made of silicon. The forming the trench is performed by an anisotropic etching method, and the trench is perpendicular to the SOI substrate.

While the invention has been described with reference to referred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
   a semiconductor substrate having a first semiconductor layer, an insulation layer and a second semiconductor layer, which are stacked in this order;
   a LDMOS transistor disposed on the first semiconductor layer; and
   a region having a dielectric constant, which is lower than that of the first or second semiconductor layer, wherein
   the region contacts the insulation layer, and
   the region is disposed between a source and a drain of the LDMOS transistor.

2. The device according to claim 1, wherein
   the semiconductor substrate is a SOI substrate,
   the insulation layer is a silicon oxide layer, and
   the first and second semiconductor layers are made of silicon.

3. The device according to claim 1, wherein
   the region is disposed between the first semiconductor layer and the insulation layer.

4. The device according to claim 3, wherein
   the region includes a plurality of parts.

5. The device according to claim 4, wherein
   each part of the region has a same thickness in a direction perpendicular to the semiconductor substrate.

6. The device according to claim 4, wherein
   each part of the region has a same width in a direction parallel to a direction between the source and the drain of the LDMOS transistor.

7. The device according to claim 4, wherein
   the parts of the region are arranged equally spaced in a direction parallel to a direction between the source and the drain of the LDMOS transistor.

8. The device according to claim 1, wherein
   the region has a corner, which is rounded.

9. The device according to claim 1, further comprising:
a trench for electrically isolating the LDMOS transistor, wherein
the trench reaches the insulation layer,
the trench surrounds a portion of the first semiconductor layer, and
the region corresponds to whole area of the portion of the first semiconductor layer.

10. The device according to claim 1, wherein
the region is a hollow.

11. The device according to claim 1, wherein
the region is made of silicon oxide, silicon oxide including carbon, silicon oxide including fluorine, fluoro-polyimide or cyclized perfluoro-polymer.

12. The device according to claim 1, wherein
the first semiconductor layer has a N conductive type.

13. The device according to claim 12, further comprising:
a P conductive type region disposed between the source and the drain of the LDMOS transistor and disposed on a surface of the first semiconductor layer.

14. The device according to claim 1, wherein
the device has a withstand voltage, which is equal to or larger than 700 volts.

15. The device according to claim 14, wherein
the device is an in-vehicle semiconductor device for an automotive vehicle, and
the device provides a level shift circuit in a high voltage IC for driving an inverter.

* * * * *